United States Patent
Yu et al.

(10) Patent No.: US 8,217,499 B2
(45) Date of Patent: Jul. 10, 2012

(54) STRUCTURE TO REDUCE ETCHING RESIDUE

(75) Inventors: Tsung-Yuan Yu, Taipei (TW); Hsien-Wei Chen, Sinying (TW); Chung-Ying Yang, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 72 days.

(21) Appl. No.: 12/952,485

(22) Filed: Nov. 23, 2010

(65) Prior Publication Data

US 2012/0126359 A1    May 24, 2012

(51) Int. Cl.
*H01L 23/544*    (2006.01)

(52) U.S. Cl. ......... 257/620; 257/E23.124; 257/E21.238; 438/114

(58) Field of Classification Search .................. 257/620, 257/E23.124, E21.238; 438/114
See application file for complete search history.

(56) References Cited

U.S. PATENT DOCUMENTS

| | | | | |
|---|---|---|---|---|
| 7,795,705 B2 * | 9/2010 | Tsutsue | ......... | 257/620 |
| 8,018,030 B2 * | 9/2011 | Furusawa et al. | ............. | 257/620 |
| 2005/0087878 A1 * | 4/2005 | Uesugi et al. | ................. | 257/758 |
| 2006/0278957 A1 * | 12/2006 | Lin et al. | ....................... | 257/620 |

* cited by examiner

*Primary Examiner* — Trung Q Dang
(74) *Attorney, Agent, or Firm* — Slater & Matsil, L.L.P.

(57) ABSTRACT

A structure for reducing partially etched materials is described. The structure includes a layout of an intersection area between two trenches. First, a large intersection area having a trapezoidal corner may be replaced with an orthogonal intersection between two trenches. The layout reduces the intersection area as well as the possibility of having partially etched materials left at the intersection area. The structure also includes an alternative way to fill the intersection area with either an un-etched small trapezoidal area or multiple un-etched square areas, so that the opening area at the intersection point is reduced and the possibility of having partially etched materials is reduced too.

19 Claims, 6 Drawing Sheets

STRUCTURE TO REDUCE ETCHING RESIDUE

BACKGROUND

In the semiconductor process, integrated circuits are fabricated on a semiconductor wafer. The semiconductor wafer goes through many processing steps before a plurality of integrated circuits are separated by cutting the semiconductor wafer. The processing steps may include lithography, etching, doping and depositing different materials.

Etching is a processing step by which one or several layers can be removed from a wafer. There are two types of etching: wet etching and dry etching. Wet etching is an etching process that utilizes liquid chemicals to remove materials on top of a wafer. On the other hand, dry etching is an etching process that uses either plasma or reactive gases to remove materials from the wafer. Generally, a semiconductor wafer may go through many etching steps before the etching process is complete. Such etching steps include nitride etch, poly etch, spacer etch, contact etch, via etch, metal etch, and the like.

Post etch residue is a major defect in an etching process. An etch island resulted from a partially etched layer may cause quality issues. For example, a blocked etch metal island may cause a short between two neighboring metal structures. Further complicating this problem may be the trend of maximizing the number of dies produced by a wafer. In order to maximize productivity, the physical size of a semiconductor die is further reduced so that a wafer can accommodate more semiconductor dies. However, a die-size shrink may cause two neighboring metal structures in a semiconductor die much closer. Accordingly, a relatively large etch residue such as a blocked etch metal island has a high possibility of causing a short between two metal structures adjacent to the blocked etch metal island.

One typical method for avoiding the short between two neighboring structures is based upon an adjustment of two neighboring structures' width. One example is a seal ring structure that is employed to reduce the stress induced during a wafer sawing process. In order to prevent etching induced defects such as a partially etched residue, the width of the seal ring is reduced. However, a seal ring having a narrow structure may not protect integrated circuits from the lateral stress induced during a wafer sawing process.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a seal ring layout. The invention may also be applied, however, to other semiconductor structures.

In a semiconductor wafer, a plurality of dies are fabricated next to each other on a wafer, separated by scribe lines. In a wafer sawing process, all dies on a semiconductor wafer are cut off along the scribe lines. A seal ring structure is a protection structure placed between a scribe line and a die, so that the seal ring can reduce the possibility of having cracks on the die by acting as a buffer absorbing the stress induced from wafer sawing. The buffer further includes an isolation area, which provides an isolation distance between the die and the seal ring.

Figure 1A:
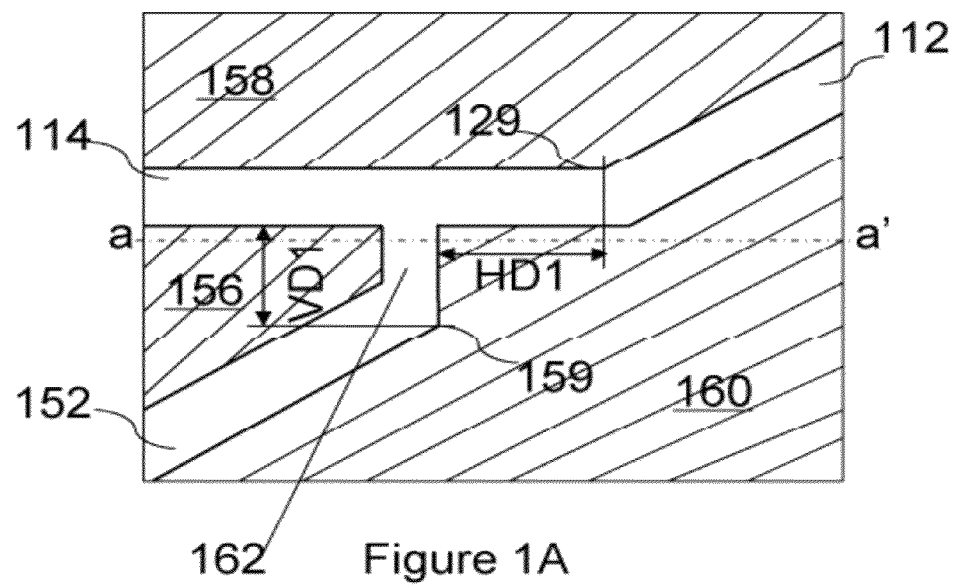
FIGS. 1A-1D illustrate a layout in accordance with an embodiment.

To have a reliable seal ring structure as well as residue free etching, a layout of an acute-angled corner is shown in FIGS. 1A-1D. FIG. 1A includes four trenches resulted from an etching process. A first trench 114 is oriented to have a first axis in a first direction. A second trench 152 is oriented to have a second axis in a second direction. As shown in FIG. 1A, the first trench does not insect the second trench. However, the first direction and the second direction form an acute-angled corner (not shown in FIG. 1A). FIG. 1A further includes a third trench 162. At one end, the third trench 162 is connected to one end of the second trench 152 at an intersection point 159. At the other end, the third trench 162 has an orthogonal intersection with the first trench 114.

As shown in FIG. 1A, the first trench 114, the second trench 152 and the third trench 162 define a trapezoidal area 156. The first trench 114 includes an extension trench extending in a third direction from the first trench at a turning point 129. In FIG. 1A, the extension trench is designated as a fourth trench 112. The trapezoidal area 156 formed by the first trench 114, the second trench 152 and the third trench 162 has a right angle at the intersection point between the first trench 114 and the third trench 162. By employing such a layout pattern, the corners at the intersection between the first trench 114 and the third trench 162 have an angle approximately equal to ninety degrees. FIG. 1A further includes a first region 158 defined by the first trench 114 and the fourth trench 112. Likewise, the second trench 152, the third trench 162, the first trench 114 and the fourth trench 112 form a second region 160. As shown in FIG. 1A, the trapezoidal area 156, the first region 158 and the second region 160 may be covered with a photoresist etch mask layer 132 (not shown in FIG. 1A but illustrated in FIG. 1B).

Two parameters in this layout pattern may affect the possibility of having partially etched materials. One parameter is a horizontal distance HD1 between the right edge of the third trench 162 and the turning point 129. Another parameter is a vertical distance VD1 between the bottom edge of the first trench 114 and the intersection point 159. In this exemplary embodiment, the width of the trenches (e.g., trench 114) is about 0.5 µm. In one embodiment, both HD1 and VD1 may be equal to or more than 0.5 µm. In another embodiment, the width of the trenches may have a range between 0.032 µm and 1.81 µm. One or more trenches may be less than 0.5 µm. It should be noted that the layout described above reduces the possibility of having a partially etched area left in the intersection region formed by the trenches 114 and 152. In some circumstances, some materials are still partially etched. However, the size of the partially etched materials may be reversely proportional to HD1.

Figure 1B:
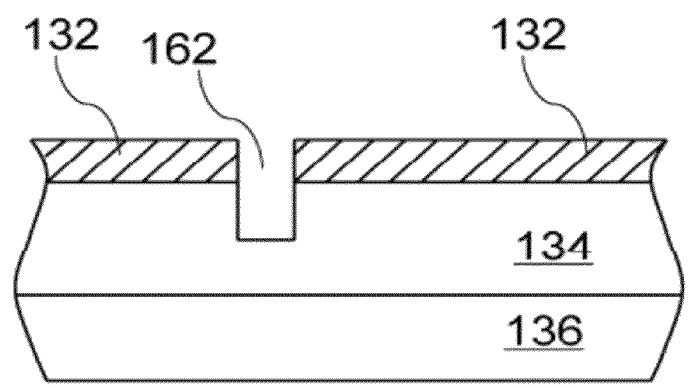

FIG. 1B is a cross-sectional view of the seal ring structure along line a-a' in FIG. 1A. The seal ring structure is formed on a substrate 136. The substrate 136 is known in the art of semiconductor fabrication, and hence is not discussed herein. An exemplary layer 134 is formed on the substrate 136. The formation of the exemplary layer 134 is known in the art of semiconductor fabrication. It should be noted that a single layer is selected purely for demonstration purposes and is not intended to limit the various embodiments to a single layer. One skilled in the art will recognize that disclosure is applicable to a semiconductor structure having a single layers as well as a structure having multiple layers. In order to form a trench, a patterned photoresist etch mask layer 132 is formed on top of the exemplary layer 134. The patterned photoresist etch mask layer 132 is formed by the methods known in the art of photolithography commonly used in semiconductor fabrication. Therefore, the detailed description of photolithography is not discussed herein.

As illustrated in FIG. 1B, the trench 162 is fully etched. The layout depicted in FIG. 1A helps to produce a fully etched trench in accordance with the etch pattern. This will be shown in further detail below with respect to FIG. 1C and FIG. 1D. In short, an advantageous feature of the described embodiment is that the layout can reduce the size of an intersection area between two trenches, so that the possibility of having partially etched materials is reduced.

Figure 1C:
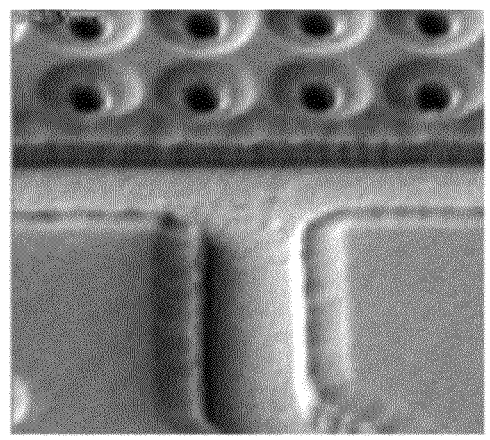
Figure 1D:
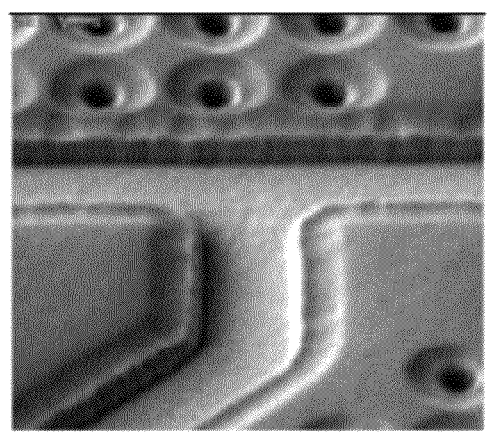

FIG. 1D illustrates a residue free area based upon the layout. According to the basic principle of the layout for reducing partially etched materials, an orthogonal intersection between two trenches minimizes the intersection area so that it helps to reduce the possibility of having partial etched materials left at the intersection area. As shown in FIG. 1D, the trapezoidal corner may help to completely remove the materials at an intersection area during an etching process. FIG. 1C gives a view of the trenches shown in FIG. 1D from a different angle. Clearly, both FIG. 1C and FIG. 1D show there are no partially etched materials left by employing the layout shown in FIG. 1A.

FIGS. 2A-2D illustrate a layout in accordance with another embodiment. As discussed with respect to FIG. 1, a large intersection area between two trenches (e.g., trench 212 and trench 114 shown in FIG. 2A) may cause some partially etched materials left in the large opening area surrounded by a triangle region 220, the first region 158 and the trapezoidal region 156. In order to reduce the size of the large opening area, a trapezoidal area 210 is intentionally added to partially fill the opening area. By adding the trapezoidal area 210 at the intersection area, the opening area is reduced and the possibility of having partially etched materials is reduced too.

Figure 2A:
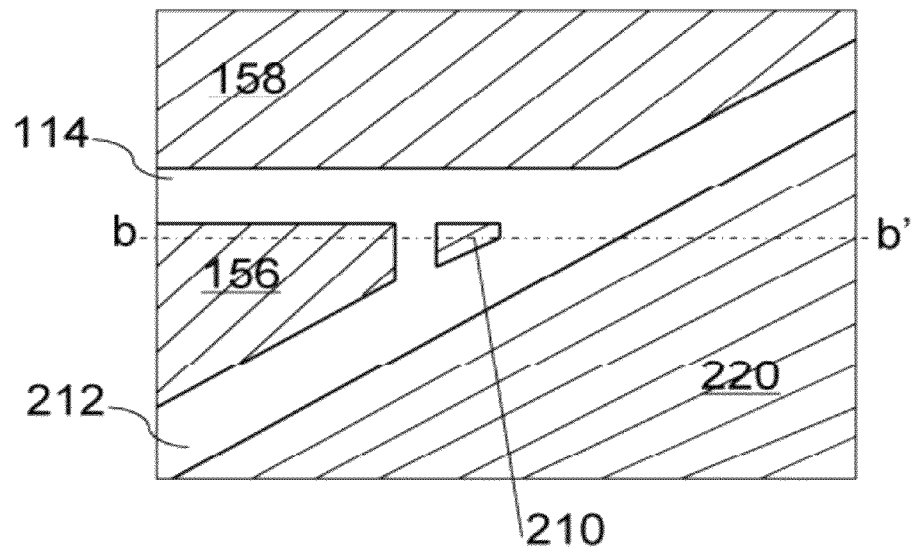
FIGS. 2A-2D illustrate a layout in accordance with another embodiment.
Figure 2B:
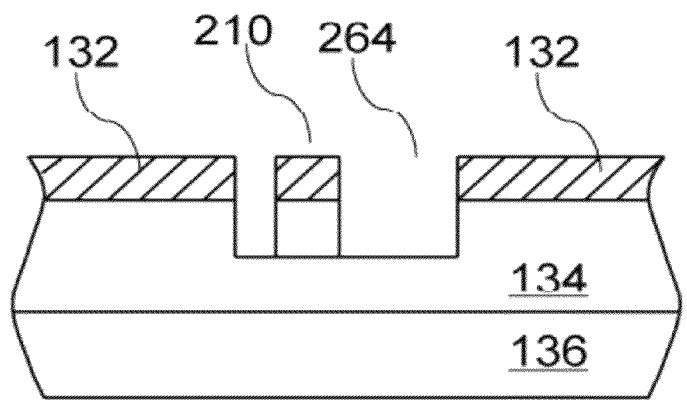
Figure 2C:
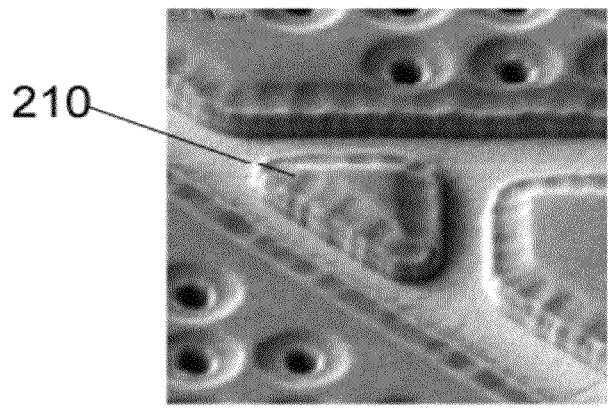
Figure 2D:
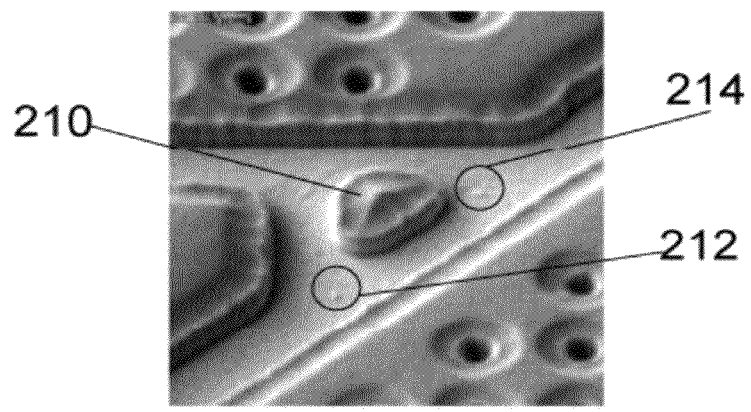

FIG. 2B is a cross-sectional view of the layout along line b-b' in FIG. 2A. FIG. 2B includes the substrate 136, the exemplary layer 134 and the patterned photoresist etch mask layer 132, which are discussed above with respect to FIG. 1B. As illustrated in FIG. 2B, a trench 264 is fully etched except the trapezoidal area 210, which is intentionally kept in accordance with the layout shown in FIG. 2A. Such a layout helps to reduce partially etched materials. FIG. 2C illustrates an advantageous feature of the layout. The trapezoidal area 210 may prevent an etching process from producing a residue at an intersection area. FIG. 2D illustrates the impact of having a relatively small trapezoidal area filled in the opening area. Circles 212 and 214 highlight some tiny post etch residues. Although the proposed layout may not completely remove some tiny blocks shown in FIG. 2D, such small blocks may not cause semiconductor fabrication defects. An advantageous feature of the described embodiment is that the layout can reduce the possibility of having partially etched materials by adding an un-etched trapezoidal area at an intersection area.

Figure 3A:
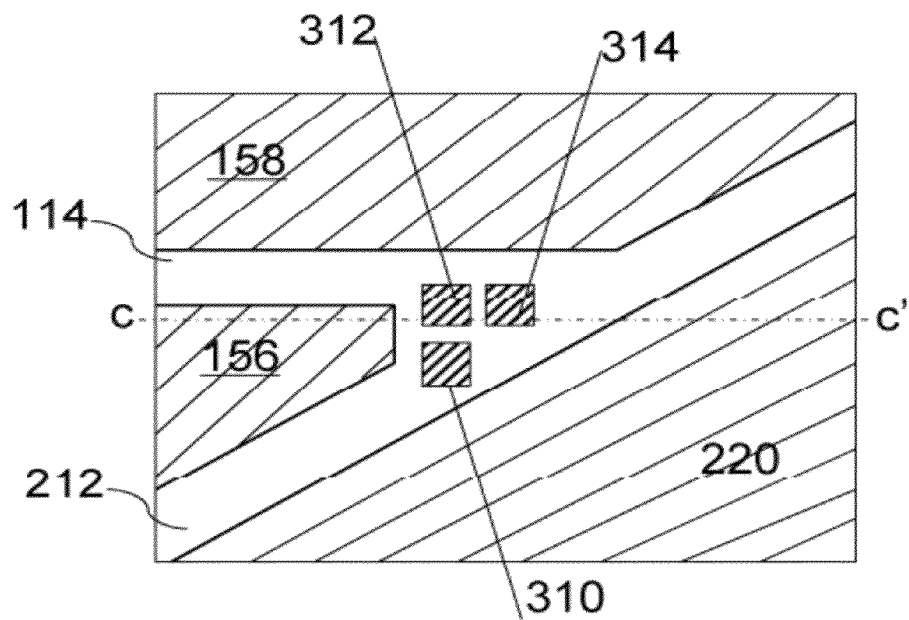
FIGS. 3A-3D illustrate a layout in accordance with yet another embodiment.

FIGS. 3A-3D illustrate a layout in accordance with yet another embodiment. FIG. 3A provides another way to fill a large opening area by adding three un-etched square regions 310, 312 and 314. While FIG. 3A illustrates the opening area includes three un-etched square regions, the opening area could accommodate any number of un-etched square regions. The present disclosure is not limited to any specific number of square regions. In addition, it should be noted that the square shape used in this embodiment is selected purely for demonstration purposes and are not intended to limit the various embodiments of the present disclosure to any particular shapes.

Figure 3B:
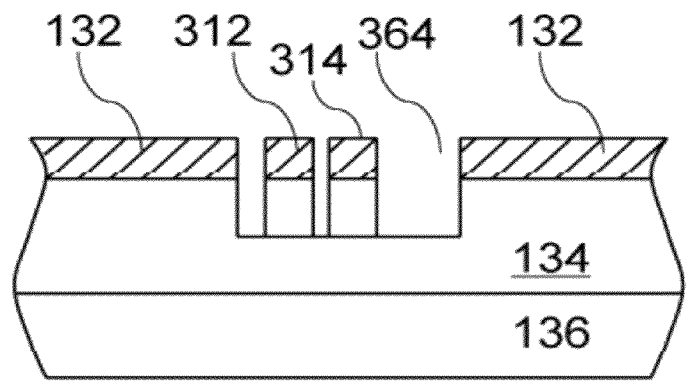
Figure 3C:
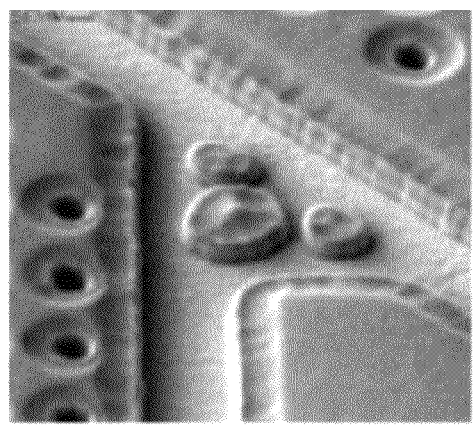
Figure 3D:
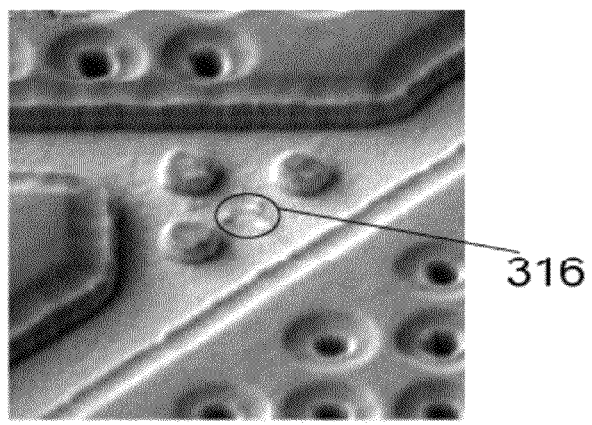

The FIG. 3B is a cross-sectional view of the layout along line c-c' in FIG. 3A. As illustrated in FIG. 3B, a trench 364 is fully etched except two square areas 312 and 314, which are intentionally kept in accordance with the etching pattern shown in FIG. 3A. FIG. 3C illustrates an advantageous feature of the layout. Three un-etched square regions 310, 312 and 314 may prevent an etching process from producing partially etched materials. FIG. 3D illustrates the impact of having relatively small un-etched square regions filled in the opening area. A circle 316 highlights some tiny post etch residues. Although the proposed layout may not completely remove some tiny blocks shown in FIG. 3D, such small blocks may not cause semiconductor fabrication defects. As FIGS. 3C and 3D illustrate, so-called "square" regions will actually appear round or rounded after actual processing steps.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
    a first trench oriented to have a first axis in a first direction;
    a second trench oriented to have a second axis in a second direction, the second direction forming an acute angle with the first direction;
    a third trench connecting the first and second trenches, the third trench extending orthogonal to the first direction and intersecting the second trench; and
    a fill feature formed in an intersection area formed by the first trench, the second trench and the third trench.

2. The structure of claim 1, wherein the fill feature has a shape selected from the group consisting of a trapezoidal, a square, a plurality of squares, a circle, and a plurality of circles.

3. The structure of claim 1, wherein the first trench includes an extension trench extending in a third direction, the extension trench extending from the first trench at a turning point, and wherein:
  a distance between the turning point and the third trench is equal to or greater than a width of the first trench.

4. The structure of claim 1, wherein the length of the third trench is equal to or greater than a width of the first trench.

5. The structure of claim 1, wherein the width of the first trench has a range between 0.032 µm and 1.81 µm.

6. The structure of claim 1, wherein the first, second, and third trench are each of the same width.

7. The structure of claim 1, wherein the first, second, and third trench form a trapezoidal corner.

8. The structure of claim 1, wherein the first, second, and third trench form at least a portion of a seal ring.

9. A semiconductor device comprising:
  a seal ring structure; and
  an integrated circuit die surrounded by the seal ring structure;
  wherein the seal ring structure comprises:
    a first trench oriented to have a first axis in a first direction;
    a second trench oriented to have a second axis in a second direction, the second direction forming an acute angle with the first direction; and
    a third trench connecting the first and second trenches, the third trench extending orthogonal to the first direction and intersecting the second trench.

10. The semiconductor device of claim 9, further comprising one fill feature formed in an intersection area formed by the first trench, the second trench and the third trench wherein the fill feature having a right triangle shape is connected to a side wall of the second trench.

11. The semiconductor device of claim 10, wherein the fill feature has a shape selected from the group consisting of a trapezoidal, a square, a plurality of squares, a circle, and a plurality of circles.

12. The semiconductor device of claim 9, further comprising an isolation area located between the seal ring structure and the integrated circuit die.

13. The semiconductor device of claim 9, wherein the first trench includes an extension trench extending in a third direction, the extension trench extending from the first trench at a turning point, and wherein:
  a distance between the turning point and the third trench is equal to or greater than a width of the first trench.

14. The semiconductor device of claim 9, wherein the length of the third trench is equal to or greater than a width of the first trench.

15. The semiconductor device of claim 9, wherein the first, second, and third trench are each of the same width.

16. The semiconductor device of claim 9, wherein the first, second, and third trench form a trapezoidal corner.

17. A method comprising:
  forming a dielectric layer;
  forming a first trench oriented to have a first axis in a first direction in the dielectric layer;
  forming a second trench oriented to have a second axis in a second direction in the dielectric layer, the second direction forming an acute angle with the first direction;
  forming a third trench connecting the first and second trenches, the third trench extending orthogonal to the first direction and intersecting the second trench;
  forming a fill feature formed in an intersection area formed by the first trench, the second trench and the third trench; and
  filling the first, second and third trenches with conductive materials.

18. The method of claim 17, wherein the first, second and third trenches form a trapezoidal corner.

19. The method of claim 17, wherein the length of the third trench is equal to or greater than the width of the first trench.

* * * * *